(12) United States Patent
Mahler et al.

(10) Patent No.: US 9,648,735 B2
(45) Date of Patent: May 9, 2017

(54) PRINTED CIRCUIT BOARDS AND METHODS OF MANUFACTURING THEREOF

(71) Applicant: Infineon Technologies AG, Neubiberg (DE)

(72) Inventors: Joachim Mahler, Regensburg (DE); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/729,158

(22) Filed: Jun. 3, 2015

(65) Prior Publication Data

US 2015/0359091 A1 Dec. 10, 2015

(30) Foreign Application Priority Data

Jun. 5, 2014 (DE) .................. 10 2014 107 909

(51) Int. Cl.
| | |
|---|---|
| H05K 1/03 | (2006.01) |
| H05K 3/00 | (2006.01) |
| H05K 1/11 | (2006.01) |
| H05K 3/10 | (2006.01) |
| H05K 3/46 | (2006.01) |

(52) U.S. Cl.
CPC ............. *H05K 1/032* (2013.01); *H05K 1/115* (2013.01); *H05K 3/007* (2013.01); *H05K 3/0094* (2013.01); *H05K 3/105* (2013.01); *H05K 1/0373* (2013.01); *H05K 3/4626* (2013.01); *H05K 2201/0129* (2013.01); *H05K 2201/0215* (2013.01); *H05K 2201/0224* (2013.01); *H05K 2201/0281* (2013.01); *H05K 2203/107* (2013.01); *H05K 2203/1136* (2013.01); *Y10T 29/49126* (2015.01); *Y10T 428/24909* (2015.01)

(58) Field of Classification Search
CPC ........ H05K 1/09; H05K 1/0313; H05K 3/182; H05K 3/188; H05K 3/185; H05K 2201/0326; H05K 2201/0364; H05K 2203/0716; H05K 2203/1105; H05K 2203/10; H05K 3/18; H05K 1/03
USPC ....................................................... 174/256
See application file for complete search history.

(56) References Cited

U.S. PATENT DOCUMENTS

| | | | | |
|---|---|---|---|---|
| 4,307,147 A * | 12/1981 | Ohishi | ................ | H01L 23/3737 257/E23.107 |
| 6,162,849 A * | 12/2000 | Zhuo | ..................... | C08K 3/38 524/404 |
| 7,730,613 B2 * | 6/2010 | Vasoya | ................ | H05K 3/4641 174/255 |
| 8,330,050 B2 * | 12/2012 | Sakaguchi | ............ | H01L 21/486 174/250 |
| 2005/0019535 A1 * | 1/2005 | Vasoya | ..................... | B32B 5/26 428/209 |
| 2006/0127686 A1 * | 6/2006 | Meloni | ...................... | C08J 5/18 428/473.5 |
| 2010/0028689 A1 * | 2/2010 | Yung | ...................... | C08G 59/38 428/418 |
| 2012/0193131 A1 * | 8/2012 | Kusakawa | ............ | H05K 1/056 174/256 |

* cited by examiner

*Primary Examiner* — Michael F McAllister
(74) *Attorney, Agent, or Firm* — Murphy, Bilak & Homiller, PLLC

(57) ABSTRACT

A printed circuit board includes an electrically conductive layer and a dielectric layer including a polymer, wherein the polymer includes metallic particles.

12 Claims, 5 Drawing Sheets

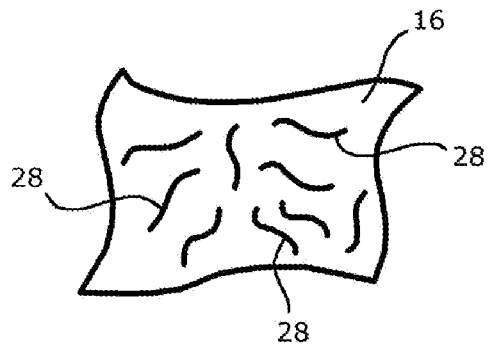
Fig. 7
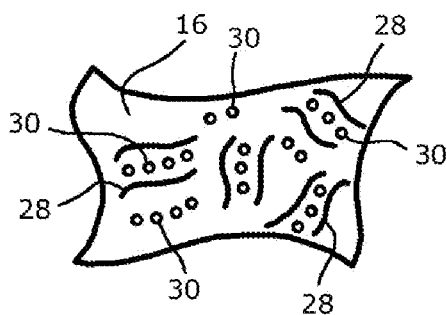
Fig. 8
Forming a dielectric layer of a PCB, wherein the dielectric layer includes a polymer including a layer structure — 32
Fig. 9

PRINTED CIRCUIT BOARDS AND METHODS OF MANUFACTURING THEREOF

PRIORITY CLAIM

This application claims priority to German Patent Application No. 10 2014 107 909.4 filed on 5 Jun. 2014, the content of said application incorporated herein by reference in its entirety.

TECHNICAL FIELD

The disclosure relates to printed circuit boards (PCBs). In addition, the disclosure relates to methods of manufacturing PCBs.

BACKGROUND

Electronic arrangements may include PCBs and electronic components that may be arranged over or in the PCBs. During operation, the electronic components may generate thermal energy that may affect performance and reliability of the electronic arrangements. PCBs and methods of manufacturing PCBs constantly have to be improved. In particular, it may be desirable to provide an efficient and stable operation of an electronic arrangement including a PCB.

SUMMARY

A printed circuit board is disclosed. According to an embodiment, the printed circuit board includes an electrically conductive layer, and a dielectric layer including a polymer. The polymer comprises metallic particles.

According to another embodiment, the printed circuit board includes an electrically conductive layer, and a dielectric layer including a polymer. The polymer includes at least one of a carbon layer structure and a carbon-like layer structure.

A method is disclosed. According to an embodiment, the method includes forming a dielectric layer of a printed circuit board. The dielectric layer includes a polymer. The polymer includes at least one of metallic particles, a carbon layer structure, and a carbon-like layer structure.

BRIEF DESCRIPTION OF THE DRAWINGS

The accompanying drawings are included to provide a further understanding of embodiments and are incorporated in and constitute a part of this description. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals may designate corresponding similar parts.

FIG. 7 schematically illustrates an example of a dielectric material that may include a polymer, according to an embodiment. The polymer may include a layer structure. The dielectric material may be included in a PCB.

FIG. 8 schematically illustrates an example of a dielectric material that may include a polymer, according to an embodiment. The polymer may include a layer structure and a material that may be arranged between layers of the layer structure. The dielectric material may be included in a PCB.

FIG. 9 schematically illustrates a flow diagram illustrating an exemplary method of manufacturing a PCB, according to an embodiment.

DETAILED DESCRIPTION

Figure 1:
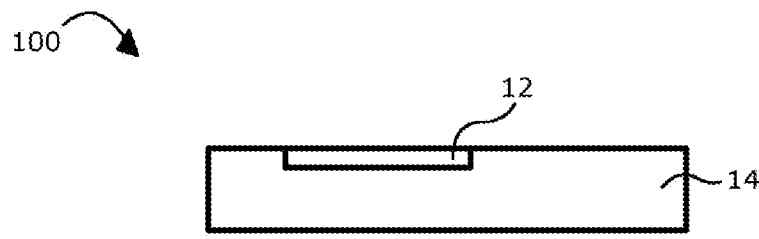
FIG. 1 schematically illustrates a cross-sectional view of an exemplary PCB, according to an embodiment.

In the following detailed description, reference is made to the accompanying drawings in which are shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the scope of the present disclosure. Hence, the following detailed description is not to be taken in a limiting sense, and the scope of the present disclosure is defined by the appended claims.

As employed in this description, the terms "connected," "coupled," "electrically connected," and/or "electrically coupled" are not meant to necessarily mean that elements must be directly connected or coupled together. Intervening elements may be provided between the "connected," "coupled," "electrically connected," or "electrically coupled" elements.

Further, the word "over" used with regard to e.g., a material layer formed or located "over" a surface of an object may be used herein to mean that the material layer may be located (e.g., formed, deposited, etc.) directly on, e.g., in direct contact with, the implied surface. The word "over" used with regard to e.g., a material layer formed or located over a surface may also be used herein to mean that the material layer may be located (e.g., formed, deposited, etc.) indirectly on the implied surface with e.g., one or more additional layers being arranged between the implied surface and the material layer.

PCBs and methods of manufacturing PCBs are described herein. Comments made in connection with a described PCB may also hold true for a corresponding manufacturing method and vice versa. For example, if a specific component of a PCB is described, a corresponding method of manufacturing the PCB may include an act of providing the component in a suitable manner, even if such act is not explicitly described or illustrated in the figures. In addition, the features of the various exemplary aspects described herein may be combined with each other, unless specifically noted otherwise.

A PCB may mechanically support and electrically connect electronic components using conductive tracks, contacts pads and further technical features that may be produced from electrically conductive layers that may be formed over a non-conductive substrate. In one example, a PCB may be single sided (e.g., one copper layer). In further examples, a PCB may be double sided (e.g., two copper layers), or multi-layered. Conductors arranged over different layers may be connected by plated-through holes (or via connections). A PCB may include components, such as capacitors, resistors, and active devices, that may also be embedded in the substrate.

A PCB may only include electrically conductive connections (e.g. copper connections), but no embedded components. Such board may be referred to as Printed Wiring Board (PWB) or etched wiring board. Alternatively, a PCB may include electronic components and may then be referred to as Printed Circuit Assembly (PCA), Printed Circuit Board Assembly, or PCB Assembly (PCBA). The term PCB as used herein may be used both for bare and assembled boards. The present description is not restricted to a specific type of PCB.

Semiconductor chips of any of a variety of types may be arranged over and/or in a PCB. For example, the semiconductor chips may include at least one of integrated electrical, electro-optical or electromechanical circuits, passive circuits, etc. The integrated circuits may be designed as at least one of logic integrated circuits, analog integrated circuits, mixed signal integrated circuits, power integrated circuits, memory circuits, integrated passives, microelectromechanical systems, etc. In one example, the semiconductor chips may include one or more power semiconductors. Such power semiconductor chips may be configured as at least one of diodes, power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. In one example, a semiconductor chip may be included in a surface mounted device (SMD). The semiconductor chips may be made of or may include an elemental semiconductor material, for example Si, etc. In addition, the semiconductor chips may also be made of or may include a compound semiconductor material, for example at least one of SiC, SiGe, GaAs, etc. The semiconductor chips may be packaged or unpackaged. A semiconductor package may correspond to a semiconductor device that may include an encapsulation material that may at least partly encapsulate one or more components of the semiconductor device.

In general, a PCB may be manufactured by using at least one of laminates, copper-clad laminates, resin impregnated B-stage cloth (prepreg), copper foil, conductive ink, etc. Laminate materials may include at least one of BT-Epoxy, composite epoxy material, CEM-1,5, cyanate ester, FR-2, FR-4, polyimide, PTFE, polytetrafluoroethylene (Teflon), etc. A PCB in accordance with the disclosure may include one or more of the materials specified in the following.

FIG. 1 schematically illustrates a cross-sectional view of a PCB 100, according to an embodiment. The PCB 100 may include an electrically conductive layer 12. In addition, the PCB 100 may include a dielectric layer 14 that may include a polymer. The polymer may include metallic particles. In the example of FIG. 1, the PCB 100 is illustrated in a general manner, but may include further components that are not illustrated for the sake of simplicity. For example, the PCB 100 may include one or more components specified in connection with other PCBs in accordance with the disclosure.

In the example of FIG. 1, the electrically conductive layer 12 is indicated as a layer that may be arranged over an upper surface of the dielectric layer 14. The chosen illustration is exemplary and in no way limiting. In one example, the electrically conductive layer 12 may at least partly be arranged over a surface of the dielectric layer 14. In a further example, the electrically conductive layer 12 may at least partly be arranged in the dielectric layer 14. The electrically conductive layer 12 may include one or more electrically conductive conductor tracks. In addition, the electrically conductive layer 12 may include one or more via connections that may at least partly extend through the PCB 100 and may be configured to electrically couple different parts of the electrically conductive layer 12.

Exemplary dielectric materials that may be used for manufacturing the dielectric layer 14 of the PCB 100 are described in connection with FIGS. 2 to 5.

During operation, an electronic component (not illustrated) arranged over or in the PCB 100 may produce thermal energy that may heat up the arrangement. For example, power semiconductor devices may generate temperatures in a range from about 140° C. to about 200° C., more particular in a range from about 150° C. to about 175° C. In some cases, the temperature may also rise to values greater than 200° C. Here, increased heat dissipation inside the arrangement may be desirable in order to spread the thermal energy over the PCB 100 and/or to support heat dissipation in a direction away from the heat sources and electronic components. Such heat dissipation may be supported by employing one or more of the dielectric materials described below.

Figure 2:
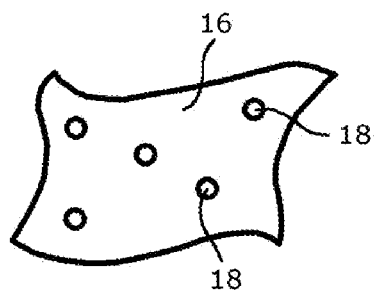
FIG. 2 schematically illustrates an example of a dielectric material that may include a polymer, according to an embodiment. The polymer may include metallic particles. The dielectric material may be included in a PCB.

FIG. 2 schematically illustrates an example of a dielectric material that may be included in a PCB in accordance with the disclosure. For example, the dielectric material may be used for manufacturing the dielectric layer 14 of the PCB 100. The dielectric material may include a polymer 16 that may include metallic particles 18. In particular, the polymer 16 may include at least one of a thermoplastic polymer, a thermoset polymer, and a mixture thereof. Even more particular, the polymer 16 may include a high-performance thermoplastic polymer that may withstand long-term service temperatures of at least about 150° C. and short-term use temperatures that may be greater than about 250° C.

A thermoplastic material that may be included in the polymer 16 may include at least one of amorphous polymers, and crystalline polymers. For example, the thermoplastic polymers may include at least one of polyether ether ketone (PEEK), polyamide-imide (PAI), polyethersulfone (PES), polysulfone (PSU), polytetrafluoroethylene (PTFE), polyphenylene sulfide (PPS), and a liquid-crystal polymer (LCP).

At room temperature thermoplastic polymers may be hard and may not necessarily require a cure. Thermoplastic polymers may be processed by increasing a temperature above a particular value at which the material may become soft or liquid. This temperature may be referred to as glass transition temperature for an amorphous thermoplastic polymer or melting temperature for a crystalline or semi-crystalline thermoplastic material. A glass transition temperature for an amorphous thermoplastics or a melting temperature for a crystalline or semi-crystalline thermoplastics that may be used in forming the dielectric layer 14 may be equal or greater than about 260° C. With a glass transition temperature or melting temperature above 260° C., the dielectric material 16 included in the PCB 100 does not necessarily become soft during processing steps as e.g. soldering electronic components onto the PCB 100.

A thermoplastic material may be heated once or multiple times. Each time a thermoplastic polymer may be heated above its glass transition or melting temperature, it may become soft and it may harden when the temperature falls below this temperature. Hence, the step of softening and hardening may be reversible.

A thermoset or thermosetting polymer that may be included in the polymer 16 may include at least one of an epoxy, an acrylate, an acrylic resin, an imide, a polyimide, a silicone resin, a cyanate ester, and mixtures thereof. A thermosetting polymer is not necessarily required to be exposed to an elevated cure temperature in order to cure or induce cross-linking chemical reactions between monomers. Once the thermosetting material is cured, it may be impossible to re-soften the material.

The polymer 16 may be provided with hydrophobic characteristics such that a PCB including the dielectric material may be protected from humidity. For example, hydrophobic characteristics may be provided by including parylene that may e.g., be deposited from a gas phase.

Polymers that may be included in the dielectric material may provide a reduced thermal conductivity. In particular, the polymers may have a thermal conductivity from about 0.1 W/(m*K) to about 0.5 W/(m*K). For obtaining an increased thermal conductivity, the polymer 16 may be filled with electrically conductive particles, for example the metallic particles 18. Metals may have a thermal conductivity from about 10 W/(m*K) to about 400 W/(m*K). By filling the polymer 16 with the metallic particles 18, the thermal conductivity of the dielectric material may be adjusted.

The thermal conductivity may be a function of a volumetric fill factor of the metallic particles 18 in the polymer 16. The volumetric fill factor of the metallic particles 18 may be chosen to provide a thermal conductivity of at least about 10 W/(m*K), more particular of at least about 20 W/(m*K). The metallic filler particles 18 may be made of any appropriate metal or metal alloy. For example, a metal having a high thermal conductivity may be copper. Hence, copper may be used as filler particles. The thermal conductivity may increase proportionally with the fill factor.

Polymers may be electrically insulating while metal particles may be electrically conductive. The metallic filler particles 18 in the polymer 16 may provide electrical conductivity to the filled dielectric material. The electrical conductivity of the filled polymer 16 does not necessarily increase proportionally with the fill factor, but may rise rather abruptly at a so-called percolation threshold. The percolation threshold may occur when the fill factor may be high enough for the metallic particles 18 to touch each other and thus provide conductive paths. An exemplary formation of electrically conductive paths is described in connection with FIG. 4.

Electrical conductivity of the dielectric material may be desired and the volumetric fill factor may be chosen to have a value above the percolation threshold. With a high volumetric fill factor the thermal conductivity may be high as well. On the other hand, an electrical conductivity of the dielectric layer may be undesired and the volumetric fill factor may be chosen to have a value below the percolation threshold. With a lower volumetric fill factor the thermal conductivity may be lower as well. In particular, the volumetric fill factor of the metallic particles 18 in the polymer 16 may have a value from about 20% to about 90%.

In one example, the metallic particles 18 may be uncoated. Hence, the fill factor may be chosen to remain under the percolation threshold if electrical conductivity is to be avoided. In a further example, the metallic particles 18 may be coated with an insulator, i.e., a material having a very low electrical conductivity up to an electrical conductivity of zero.

Different volumetric fill factors of the metallic particles 18 in the polymer 16 may also result in different coefficients of thermal expansion (CTE) of the dielectric material. In particular, the volumetric fill factor of the metallic particles 18 may be chosen such that a CTE of a layer formed from the dielectric material may be similar to a CTE of at least one further component of an arrangement including the dielectric material. For example, the CTE of the dielectric material may be similar to the CTE of a semiconductor chip, the CTE of an encapsulation material, etc., that may be in contact with and/or close to the dielectric material.

Figure 3:
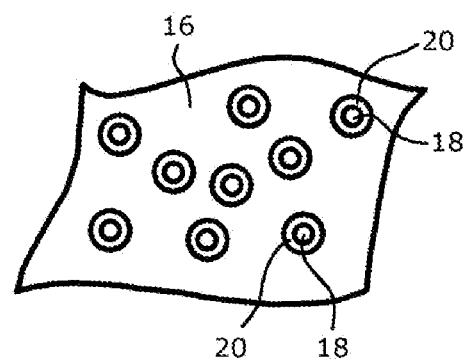
FIG. 3 schematically illustrates an example of a dielectric material that may include a polymer, according to an embodiment. The polymer may include metallic particles that may be coated with an electrically insulating material. The dielectric material may be included in a PCB.

FIG. 3 schematically illustrates an example of a dielectric material that may be included in a PCB in accordance with the disclosure. For example, the dielectric material may be used for manufacturing the dielectric layer 14 of the PCB 100. The dielectric material may include a polymer 16 that may include metallic particles 18. The metallic particles 18 may be coated with an electrically insulating material 20. For example, the electrically insulating material 20 may be made of or may include an oxide of the metal of the metallic particles 18. A coating of the metallic particles 18 may have the effect that, even with an increased volumetric fill factor, the dielectric material does not necessarily become electrically conductive. The volumetric fill factor of the metallic particles 18 in the polymer 16 may have a value from about 20% to about 90%. Even with a fill factor of near or above 90%, the filled polymer 16 does not necessarily become electrically conductive. Hence, a thermal conductivity may be increased without having an electrical conductivity of the filled polymer 16.

For example, a coating of the metallic particles 18 may be established by emerging the metallic particles 18 into an ammonium sulfate ($NH_4$) solution. Afterwards the metallic particles 18 may be heated to a temperature of about 200° C. or higher. The result may be a coating including an oxide of the metal, for example a copper oxide.

Figure 4:
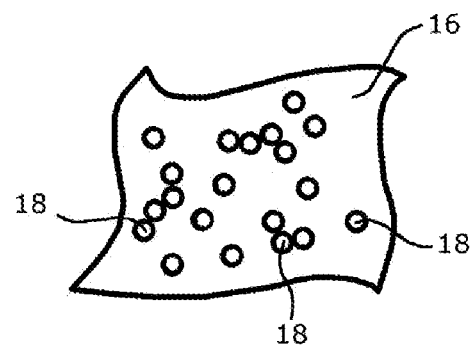
FIG. 4 schematically illustrates an example of a dielectric material that may include a polymer, according to an embodiment. The polymer may include metallic particles that may form electrically conductive paths. The dielectric material may be included in a PCB.

FIG. 4 shows an example of a material that may be included in a PCB, according to an embodiment. The material may include a polymer 16. The polymer 16 may include non-coated metallic particles 18 with a high fill factor having a value above the percolation threshold. The metallic particles 18 may at least partly contact each other, thereby forming electrically conductive paths. To the contrary, coated metallic particles 18 as shown in FIG. 3 do not necessarily form electrically conductive paths even if they contact each other since the insulating coating layer 20 may insulate the metallic particles 18 from each other. Hence, electrical conductivity does not necessarily occur. When using coated metallic particles 18, the fill factor may thus be increased to provide a higher thermal conductivity without having an undesired electrical conductivity.

In the examples of FIGS. 2 to 4, the metallic particles 18 are schematically illustrated as spherical parts. In further examples, the metallic particles 18 may have arbitrary other forms or shapes, for example a sheet form or an elliptical form. For example, the metallic particles 18 may have dimension from about 75 μm (micrometer) to about 100 μm (micrometer).

Figure 5:
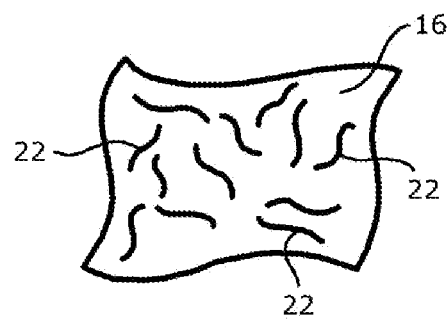
FIG. 5 schematically illustrates an example of a dielectric material that may include a polymer, according to an embodiment. The polymer may include metallic particles in the form of metallic fibers. The dielectric material may be included in a PCB.

FIG. 5 schematically illustrates an example of a dielectric material that may be included in a PCB, according to an embodiment. For example, the dielectric material may be used for manufacturing the dielectric layer 14 of the PCB 100. The dielectric material may include a polymer 16 that may include metallic particles in the form of metallic fibers 22. In one example, the metallic fibers 22 may be made of or may include at least one of copper, and a copper alloy. The metallic fibers 22 may be coated or uncoated. The metallic fibers 22 may have a thickness from about 30 μm (micrometer) to about 120 μm (micrometer). Comments made in connection with foregoing figures may also hold true for the dielectric material of FIG. 5.

Figure 6:
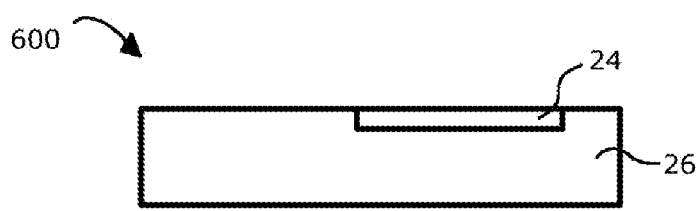
FIG. 6 schematically illustrates an exemplary PCB, according to an embodiment.

FIG. 6 schematically illustrates a cross-sectional view of a PCB 600, according to an embodiment. The PCB 600 may be similar to the PCB 100 of FIG. 1. Comments made in connection with FIG. 1 may thus also hold true for the PCB 600 of FIG. 6. The PCB 600 may include an electrically conductive layer 24. In addition, the PCB 600 may include a dielectric layer 26 that may include a polymer. The polymer may include at least one of a carbon layer structure, and a carbon-like layer structure. In the example of FIG. 6, the PCB 600 is illustrated in a general manner, but may include further components that are not illustrated for the sake of simplicity. For example, the PCB 600 may include one or more components specified in connection with other PCBs in accordance with the disclosure.

The electrically conductive layer 24 may be similar to the electrically conductive layer 12 of FIG. 1. Exemplary dielectric materials that may be used for manufacturing the dielectric layer 26 are described in connection with FIGS. 7 and 8.

FIG. 7 schematically illustrates an example of a dielectric material that may be included in a PCB, according to an embodiment. For example, the dielectric material may be used for manufacturing the dielectric layer 26 of the PCB 600. The dielectric material may include a polymer 16. The polymer 16 of FIG. 7 may be similar to one of the polymers described in connection with FIGS. 2 to 5. The polymer 16 may include a layer structure 28. The layer structure 28 may include at least one of a carbon layer structure, a carbon-like layer structure, and a mixture thereof.

The layer structure 28 may be configured to provide similar features as the metallic particles in FIGS. 2 to 5. Hence, properties of the layer structure 28 may be chosen such that physical properties of the dielectric materials explained in connection with foregoing examples may be provided. In particular, comments made in connection with the thermal conductivity and/or electrical conductivity of the previously described dielectric materials may also hold true for a dielectric material including the layer structure 28.

A layer or sheet of the layer structure 28 may particularly provide a thermal conductivity and/or electrical conductivity in a direction parallel to its sheet surfaces. In contrast to this, a layer or sheet may be thermally insulating and/or electrically insulating in a direction perpendicular to the sheet surfaces. In the example of FIG. 7, the layers of the layer structure 28 are illustrated to be distributed in an isotrope fashion. That is, the surfaces of the sheets are not necessarily oriented in a preferred direction. However, depending on a desired function of the dielectric material, a preferred orientation of the sheets may be chosen in further examples.

In one example, the layer structure 28 may be made of or may include a carbon layer structure. For example, a carbon layer structure may include expanded graphite sheets. Expanded graphite may e.g. be produced by immersing natural flake graphite in a bath of chromic acid and concentrated sulfuric acid afterwards. Here, the crystal lattice planes may be forced apart such that the graphite may get expanded.

In a further example, the layer structure 28 may be made of or may include a carbon-like layer structure. For example, a carbon-like layer structure may include at least one of diamond, diamond like carbon, boron nitride, aluminum oxide, silicon nitride, silicon carbide, and combinations thereof.

The polymer 16 may show a reduced thermal conductivity from about 0.1 W/(m*K) to about 0.5 W/(m*K). For obtaining an increased thermal conductivity, the polymer 16 may be filled with the layer structure 28. For example, expanded graphite sheets having a density in a range from about 0.1 g/cm$^3$ to about 0.6 g/cm$^3$ may have a thermal conductivity in a range from about 10 W/(m*K) to about 100 W/(m*K) in a direction parallel to the sheet surfaces of the graphite sheets. By filling the polymer 16 with the layer structure 28, the thermal conductivity of the dielectric material may be adjusted in a desired manner.

Similar to foregoing examples, the thermal conductivity may be a function of a volumetric fill factor of the layer structure 28 in the polymer 16. The volumetric fill factor of the layer structure 28 may be chosen to provide a thermal conductivity of at least about 10 W/(m*K), more particular of at least about 20 W/(m*K). The thermal conductivity may increase proportionally with the fill factor.

In one example, the sheets of the layer structure 28 may be uncoated. In a further example, the layers may be coated with an insulator, i.e. a material having a very low electrical conductivity up to an electrical conductivity of zero. In this regard, comments made in connection with the coated particles of FIG. 3 may also hold true for the case of the layer structure 28 sheets being coated.

FIG. 8 schematically illustrates an example of a dielectric material that may be included in a PCB in accordance with the disclosure. For example, the dielectric material may be used for manufacturing the dielectric layer 26 of the PCB 600. Similar to the dielectric material of FIG. 7, the dielectric material of FIG. 8 may include a polymer 16 and a layer structure 28. In addition, the dielectric material of FIG. 8 may include a filler material 30 that may at least partly be arranged between the layers of the layer structure 28. In the example of FIG. 8, the filler material 30 is indicated by small circles. However, since the form or shape of the filler material 30 particles may be arbitrary, the chosen illustration is in no way limiting. In particular, the filler material 30 may be configured to increase a thermal conductivity of the dielectric material in a desired fashion.

In one example, the filler material 30 may include a phase change material that may be configured to absorb thermal energy. The thermal energy may e.g. be absorbed by reversibly changing a spatial molecular structure of molecules included in the phase change material. Since the absorption of thermal energy may be reversible, the absorption may be seen as a temporary storage of thermal energy during a finite time interval. For example, changing the spatial molecular structure may include a transition from a first isomer of the molecules to a second isomer of the molecules. In general, the phase change material may include at least one of a chalcogenide, a metal based phase change material, an organic based phase change material, and combinations thereof. More particular, the phase change material may include at least one of a 1-ethyl-4-[4-methoxystyryl]-quinolinium compound, a cis-stilbazolium betaine, an N,N-dialkylamino-styrene dye, a stilbene, a porphyrin, a norbornadiene, a spiro compound, an azo compound, and combinations thereof. The phase change materials may be particularly configured to absorb temperature peaks that may occur during short time periods.

In a further example, the filler material 30 may include a thermally conductive material. For example, the thermally conductive material may include at least one of diamond, diamond like carbon, boron nitride, aluminum oxide, silicon nitride, silicon carbide, and combinations thereof. The thermally conductive material may particularly have the form of micro particles and/or nano particles.

FIG. 9 schematically illustrates a flow diagram illustrating a method of manufacturing a PCB in accordance with the disclosure. In one example, the PCB 100 of FIG. 1 may be obtained by this method. In a further example, the PCB 600 may be obtained by the method of FIG. 9. The method includes an act 32 of forming a dielectric layer of a PCB. The dielectric layer may include a polymer. The polymer may include at least one of metallic particles, a carbon layer structure, a carbon-like layer structure, and combinations thereof. For example, such included materials have been described in connection with foregoing figures. The method of FIG. 9 may include further acts that are not illustrated for the sake of simplicity. For example, the method may include one or more of the acts that are described in connection with the method of FIGS. 10A to 10F.

In one example, the method of FIG. 9 may include an act of forming a through hole that may extend through the dielectric layer. During this act, at least a part of the polymer may be removed and at least a part of the metallic particles, the carbon layer structure, and/or the carbon-like layer structure may be exposed at a side wall of the formed through hole. For example, the through hole may be formed by applying a laser beam. Here, at least a part of the polymer at the side walls of the formed through hole may evaporate such that the side walls of the formed through hole may be metallized during the act.

In one example, the method of FIG. 9 may include an act of forming an electrically conductive layer on the dielectric layer by removing at least a part of the polymer and exposing at least a part of the metallic particles, the carbon layer structure, and/or the carbon-like layer structure. For example, the electrically conductive layer may be formed by applying a laser beam to the dielectric layer. During the act at least a part of the polymer may evaporate at the positions where the laser beam may be applied such that the dielectric material may be metallized during the act.

In one example, forming the dielectric layer may include an act of injection molding the polymer into a mold. More details on such injection molding act are provided below.

Figure 10A:
FIGS. 10A to 10F schematically illustrate a cross-sectional view of an exemplary method of manufacturing a PCB, according to an embodiment.
Figure 10B:
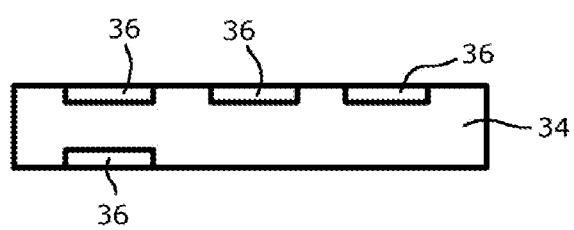
Figure 10C:
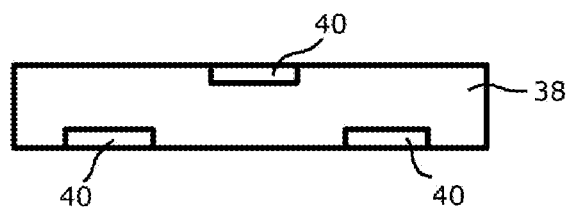
Figure 10D:
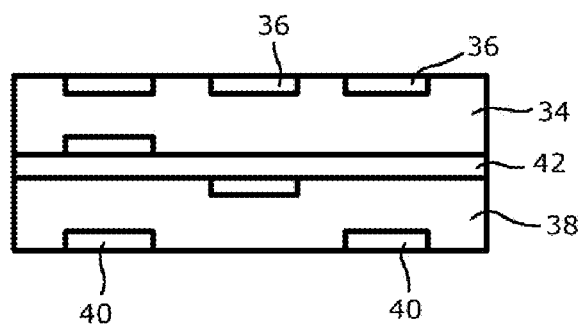
Figure 10E:
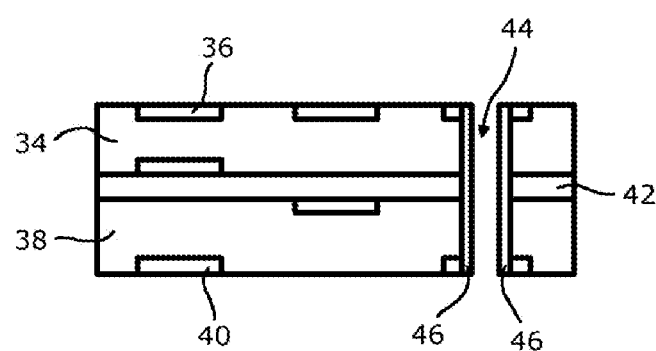
Figure 10F:
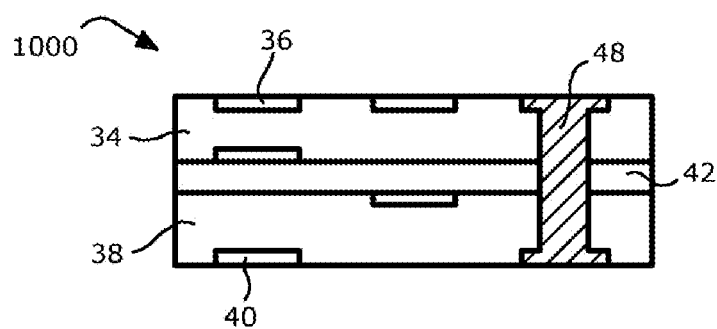

FIGS. 10A to 10F schematically illustrate a method of manufacturing a PCB, according to an embodiment. A cross section of an exemplary PCB 1000 obtained by the method is shown in FIG. 10F. Details of PCBs manufactured according to the described method may be likewise applied to any other PCB in accordance with the disclosure. In addition, the method shown in FIGS. 10A to 10F may be seen as an implementation of the method illustrated in FIG. 9. Details of the manufacturing method that are described below may therefore be likewise applied to the method of FIG. 9.

In FIG. 10A, a first dielectric layer 34 may be formed. For example, the first dielectric layer 34 may be similar to one of the dielectric layers or dielectric materials described in connection with FIGS. 1 to 8. In particular, the first dielectric layer 34 may include a polymer that may include an electrically conductive material, for example at least one of metallic particles, a carbon layer structure, a carbon-like layer structure, and combinations thereof.

The first dielectric layer 34 may be manufactured by any suitable technique or method. In one example, the first dielectric layer 34 may be manufactured using an injection molding technique. In injection molding, two parts of a polymer (e.g. polyol and isocyanate) may be mixed together, for example in a mixing head. For the case of reinforcing agents (e.g., glass fiber, carbon fiber, etc.) being added to the mixture, the process may also be referred to as reinforced reaction injection molding. The mixture may be injected in a mold (or a mold form or a mold tool) under pressure, and the mixture may expand in the mold. During an exothermic reaction, the mixture may cure and may at least partly get cross-linked. The cured first dielectric layer 34 may be removed from the mold afterwards.

In one example, filling of additional particles, such as metallic particles or sheets of a layer structure material, into the polymer may be performed by compounding. Compounding may refer to the act of mixing all ingredients together in a way that the ingredients may be randomly distributed inside the compound. In a further example, the polymer may be injected by a first nozzle while the additional particles may be injected by a separate second nozzle. By controlling the output of the first nozzle and/or second nozzle, a density or volumetric fill factor of the additional particles may be selectively increased at specific positions in the first dielectric layer 34. In other words, a thermal conductivity of the first dielectric layer 34 may be selectively increased at desired positions. For example, the density may be increased near locations where electronic components are to be placed later on. In one example, the additional particles may be localized at a main surface of the PCB to be produced.

In FIG. 10B, electrically conductive structures 36 may be formed over one or more surfaces of the first dielectric layer 34. The electrically conductive structures 36 may have arbitrary forms and shapes depending on the design of the PCB that is to be manufactured. In one example, an electrically conductive structure 36 may have the form of an electrically conductive layer that may become part of an electrically conductive redistribution layer which may be arranged over or inside the PCB to be produced. In a further example, an electrically conductive structure 36 may become a contact pad that may be arranged over a surface of the PCB. Such contact pad may be configured to provide an electrical coupling between inner electronic structures of the PCB and an electronic component that may be mounted on the PCB later on. In yet a further example, an electrically conductive structure 36 may become a part of an electrically through connection (or via connection) that may at least partly extend through the first dielectric layer 34 or the PCB to be produced. For example, the electrically conductive structure 36 may be formed by removing parts of the polymer at selected locations, thereby exposing the electrically conductive material that may be included in the polymer. In one example, the polymer may be removed by increasing the temperature at selected locations such that the polymer may evaporate. The temperature may e.g. be increased by applying a laser beam at the selected locations.

In FIG. 10C, a second dielectric layer 38 may be formed. The second dielectric layer 38 may include electrically conductive structures 40 that may be arranged on surfaces of the second dielectric layer 38. The second dielectric layer 38 may have similar properties as the first dielectric layer 34. In one example, a thermal conductivity of the second dielectric layer 38 may differ from a thermal conductivity of the first dielectric layer 34. In a further example, the thermal conductivities of the dielectric layers 34 and 38 may be similar.

In FIG. 10D, an optional prepreg layer 42 may be arranged between the first dielectric layer 34 and the second dielectric layer 38. The three layers 34, 38, 42 may be joined together, wherein the prepreg layer 42 may provide a mechanical connection between the dielectric layers 34 and 38.

In FIG. 10E, a through hole 44 may be formed in the arrangement. The through hole 44 may at least partly extend through one or both of the dielectric layers 34 and 38. In the example of FIG. 10E, the through hole 44 may extend from the upper main surface of the arrangement to the lower surface of the arrangement. In further examples, the through hole 44 may extend through only one of the dielectric layers 34 and 38. An electrically conductive material that is to be arranged in the through hole 44 later on may be configured to provide an electrical coupling between one or more of the electrically conductive structures 36 and 40.

Any suitable technique may be used for manufacturing the through hole 44. In one example, the through hole 44 may be formed by applying a laser drilling technique. Here, parts of the polymer may be removed at the side walls of the through hole 44 during the laser drilling act such that the electrically conductive material included in the respective dielectric material may be exposed. The application of a laser beam may thus result in a simultaneous formation of the through hole 44 and the formation of one or more metallization layers 46 that may be arranged over at least parts of the through hole 44 side walls.

In FIG. 10F, an electrically conductive material may be formed in the through hole 44, thereby producing a via connection 48. In the example of FIG. 10F, the via connection 48 may extend from the upper main surface of the manufactured PCB 1000 to a lower main surface of the PCB 1000. In further examples, the via connection 48 may connect parts of the electrically conductive structures 36 and 40 in an arbitrary manner. Any suitable technique may be applied for manufacturing the via connection 48. In one example, the via connection 48 may be formed by performing a galvanic deposition during which the metallization layer 46 may serve as a seed layer.

In the example of the FIG. 10F, the PCB 1000 may include two dielectric layers 34, 38. However, the number of dielectric layers and electrically conductive structures included in the PCB 1000 may be any of a variety of structures and may particularly depend on the desired functionality of the PCB 1000. In addition, the PCB 1000 may also include one or more layers made of or including dielectric materials that may be free of the described conductive filler materials.

It is to be appreciated that the described method may include further acts which are not explicitly illustrated for the sake of simplicity. For example, the method may include further acts of manufacturing passive and active electronic elements in or over the PCB 1000. In another act, electronic components may be arranged over or in the PCB 1000 and may be electrically coupled to the electrically conductive structures 36, 40.

The PCBs in accordance with the disclosure and the methods of manufacturing thereof may have the following effects. The listed effects are neither exclusive nor limiting.

Compared to other PCBs, a PCB in accordance with the disclosure may provide an improved cooling such that an arrangement including the PCB may operate at lower temperatures. Thermal energy generated by heat sources of the arrangement (e.g., operating compound semiconductor components) may dissipate effectively.

Compared to other PCBs, a PCB in accordance with the disclosure may include a dielectric material that may have hydrophobic properties which may prevent the PCB from absorbing moisture.

Compared to other PCBs, a PCB in accordance with the disclosure may have a CTE that may be similar to a CTE of one or more components of an arrangement including the PCB. For example, a CTE of the PCB may be similar to a CTE of at least one of a semiconductor chip included in the arrangement, an encapsulation material that may at least partly encapsulate components of the arrangement, etc.

Compared to other PCBs, a PCB in accordance with the disclosure may be manufactured by using an act of injection molding. Compared to other manufacturing acts, the act of injection molding may be simpler and more cost effective.

Compared to other PCBs, a PCB in accordance with the disclosure may provide the possibility of effectively forming electrically conductive structures of a PCB. Since a dielectric material of the PCB may include electrically conductive material (e.g. metallic particles), electrically conductive structures may be formed in a simple way by selectively removing the dielectric material, thereby exposing the electrically conductive material in a desired manner.

Compared to other PCBs, a PCB in accordance with the disclosure may provide the possibility of increasing the thermal conductivity of a PCB at selected locations. For example, a dielectric material having an increased thermal conductivity may be localized at a surface of the PCB, in particular at a position of an electrical component that may heat up during operation.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure is limited only by the claims and the equivalents thereof.

The invention claimed is:

1. A printed circuit board, comprising:
   an electrically conductive layer; and
   a dielectric layer comprising a polymer, wherein the polymer comprises metallic particles,
   wherein the metallic particles are localized at a main surface of the printed circuit board.

2. The printed circuit board of claim 1, wherein the polymer comprises at least one of a thermoplastic polymer, a thermoset polymer, and a mixture thereof.

3. The printed circuit board of claim 1, wherein the polymer comprises at least one of an epoxy, an acrylate, an imide, a silicone resin, and a mixture thereof.

4. The printed circuit board of claim 1, wherein a volumetric fill factor of the metallic particles in the polymer has a value between 20% and 90%.

5. The printed circuit board of claim 1, wherein a volumetric fill factor of the metallic particles in the polymer is chosen to provide a thermal conductivity of the polymer of at least 10 W/(m*K).

6. The printed circuit board of claim 1, wherein the polymer comprises an amorphous polymer with a glass transition temperature of equal or greater than 260° C., or wherein the polymer comprises a crystalline or semi-crystalline polymer with a melting temperature of equal or greater than 260° C.

7. The printed circuit board of claim 1, wherein the polymer comprises at least one of: polyether ether ketone, polyamide-imide, polyethersulfone, polysulfone, polytetrafluoroethylene, polyphenylene sulfide, and liquid-crystal polymer.

8. The printed circuit board of claim 1, wherein the metallic particles are coated with an electrically insulating material.

9. The printed circuit board of claim 8, wherein the metallic particles comprise a metal and the electrically insulating material comprises an oxide of the metal.

10. The printed circuit board of claim 1, wherein the electrically conductive layer comprises at least one of: a via connection extending through the dielectric layer, and an electrically conductive layer arranged on a surface of the dielectric layer, and wherein the metallic particles comprise a metal and at least one side wall of the via connection and the electrically conductive layer comprises the metal.

11. The printed circuit board of claim 1, wherein the polymer comprises a thermoplastic polymer.

12. A printed circuit board, comprising:
an electrically conductive layer;
a dielectric layer comprising a polymer, wherein the polymer comprises metallic particles; and
a further dielectric layer comprising a polymer, wherein the polymer of the further dielectric layer comprises metallic particles, wherein a thermal conductivity of the further dielectric layer differs from a thermal conductivity of the dielectric layer.

* * * * *